United States Patent [19]

Schiebold

[11] Patent Number: 5,498,997
[45] Date of Patent: Mar. 12, 1996

[54] TRANSFORMERLESS AUDIO AMPLIFIER

[76] Inventor: Cristopher F. Schiebold, 480 Palo Alto Ave., Palo Alto, Calif. 94301

[21] Appl. No.: 372,808

[22] Filed: Dec. 23, 1994

[51] Int. Cl.⁶ .............................. H03F 3/16; H03F 3/185
[52] U.S. Cl. ........................... 330/277; 330/269; 381/120
[58] Field of Search ................................... 330/269, 277; 381/120, 121

[56] References Cited

U.S. PATENT DOCUMENTS

| | | |
|---|---|---|
| 3,105,196 | 9/1963 | Lerner . |
| 3,142,724 | 7/1964 | Juvonen ............................ 381/120 X |
| 3,359,503 | 12/1967 | Warner, Jr. .............................. 330/277 |
| 3,828,230 | 8/1974 | Nishizawa et al. . |
| 3,968,451 | 7/1976 | Kamimura et al. ..................... 330/264 |
| 4,008,442 | 2/1977 | Todokoro . |
| 4,031,481 | 6/1977 | Yoshida ................................... 330/269 |
| 4,037,169 | 7/1977 | Suzuki .................................... 330/277 |
| 4,259,681 | 3/1981 | Nishizawa . |
| 4,375,124 | 3/1983 | Cogan . |
| 4,470,059 | 9/1984 | Nishizawa et al. . |
| 4,484,207 | 11/1984 | Nishizawa et al. . |
| 4,651,015 | 3/1987 | Nishizawa et al. . |
| 4,683,443 | 7/1987 | Young et al. . |
| 4,811,064 | 3/1989 | Nishizawa et al. . |
| 4,975,659 | 12/1990 | Butler et al. . |
| 4,994,870 | 2/1991 | Aoki et al. . |
| 5,041,796 | 8/1991 | Nambu et al. . |
| 5,047,728 | 9/1991 | Bayruns . |
| 5,155,449 | 10/1992 | Ito . |
| 5,339,048 | 8/1994 | Weber . |

FOREIGN PATENT DOCUMENTS

| | | |
|---|---|---|
| 442637 | 8/1991 | European Pat. Off. . |
| 647709 | 1/1987 | Japan . |

OTHER PUBLICATIONS

How to Design and Build Audio Amplifiers, Including Digital Circuits, Mannie Horowitz, pp. 164–165 and 282–289, 1980.

Jun–Ichi Nishizawa: Maverick in Japan, IEEE Spectrum, pp. 31–32, Dec. 1991.

Modern Power Devices, B. Jayant Baliga, pp. 135–139, 1987.

Tubes Versus Transistors—Is There An Audible Difference?, Russell O. Hamm, Journal of the Audio Engineering Society, pp. 267–273, May 1973.

Genalex Audio Amplifiers, Audio Valves in Competititon with Semiconductors, Mar. 1979.

USF Power Transistors for Use in Military Electronics Systems, David W. Hughes, RF Design, pp. 68–73, Jun. 1991.

MWT SST Series SH/G VHF/UHF Silicon Power FETS, Apr. 1991.

*Primary Examiner*—James B. Mullins
*Attorney, Agent, or Firm*—John P. O'Banion

[57] ABSTRACT

A transformerless solid state audio amplifier which exhibits the superior linearity and saturation characteristics of a triode vacuum tube amplifier, and which has an output impedance which nominally matches the impedance of a speaker is disclosed in which the gate of a low impedance transistor having triode-like current-voltage I-V characteristics is electrically coupled to an audio input source, the drain is electrically coupled to a supply voltage, a choke is connected in series between the drain and the supply voltage, and a speaker is coupled to the drain lead in parallel with the choke. Alternatively, a high impedance current source can be used instead of the choke.

12 Claims, 3 Drawing Sheets

TRANSFORMERLESS AUDIO AMPLIFIER

BACKGROUND OF THE INVENTION

1. Field of the Invention

This invention pertains generally to audio amplifiers, and more particularly to a solid state audio amplifier having a low impedance output which can directly drive a speaker without use of an impedance matching transformer.

2. Description of the Background Art

Audio amplifiers are widely used in various applications. Such amplifiers can be constructed using vacuum tubes or solid state devices.

Despite the availability of solid state amplifiers, vacuum tube amplifiers are still popular because of their substantially linear amplification characteristics. A very basic vacuum tube audio amplifier can be seen in FIG. 1. The triode amplifier of this circuit produces a substantially linear output. To the extent that there is non-linearity in the output, the amplifier will produce even order harmonic distortion which is more acceptable to the ear than odd order harmonic distortion. When driven into saturation, instead of sharp clipping, the amplifier rolls off. A drawback of vacuum tube amplifiers, however, is that they are low current, high voltage devices. Therefore, a bulky, expensive and lossy output transformer is required to drive a speaker.

A solid state equivalent of the vacuum tube audio amplifier of FIG. 1 can be seen in FIG. 2, where a bipolar junction transistor has been substituted for the vacuum tube. Transistors, unlike vacuum tubes, however, are high current devices that can produce sufficient power to drive speakers without a transformer. FIG. 3 shows a typical circuit of a transformerless equivalent of the bipolar transistor audio amplifier shown in FIG. 2, where $I_S$ represents a constant current source. This amplifier configuration exhibits soft saturation and moderately good linearity. However, the non-linearities are due to the exponential characteristics of the bipolar junction transistor and result in mostly odd order harmonic distortion. Further, the output impedance is effectively the output impedance of the bipolar junction transistor, which is typically on the order of several thousand ohms. Because the impedance of this amplifier does not match that of a typical speaker, which is on the order of a few ohms, the circuit shown in FIG. 3 is not widely used. FIG. 4, however, shows an example of the most commonly used transformerless bipolar junction transistor audio amplifier configuration. While this configuration exhibits linear amplification and relatively low output impedance due to the feedback between the base and emitter, when the circuit is over-driven the saturation is very sharp and rich in odd order harmonic distortion. By using a typical field effect transistor (FET) instead of a bipolar transistor in the circuit of FIG. 3, odd order harmonic distortion can be minimized because a field effect transistor is a square-law device which will exhibit mostly second harmonic distortion when operating in its linear mode. However, the output impedance of such amplifiers is on the order of several thousand ohms which is very high compared to the speaker impedance. Therefore, an impedance mismatch still exists. An FET can likewise be substituted for the bipolar transistor in the circuit of FIG. 4; however, the saturation behavior still remains sharp and rich in odd order harmonic distortion.

As can be seen from the foregoing, while transistor amplifier circuits can be designed with some of the desirable characteristics of vacuum tube amplifiers with regard to linearity, saturation characteristics, and output impedance, there is presently no transistor amplifier which exhibits triode vacuum tube amplifier characteristics while, at the same time, has a low output impedance which can drive a speaker directly. Those transistor amplifiers which mostly closely exhibit triode vacuum tube amplifier linearity and saturation characteristics, typically have output impedances of several thousand ohms. However, speakers have a nominal impedance of eight ohms which, in actuality, typically ranges from approximately two to sixteen ohms. Since maximum power transfer occurs when the impedance of the amplifier matches the impedance of the load, it is necessary to use an impedance matching transformer between the output of such amplifiers and the speaker. Use of such transformers, however, adds weight and cost to the amplifier. In addition, transformers are lossy circuit elements and waste power.

Therefore, there is a need for a solid state amplifier which emulates the linearity and saturation characteristics of a vacuum tube amplifier, while at the same time has an output impedance which nominally matches the impedance of a speaker. The present invention satisfies that need, as well as others, and overcomes the deficiencies in previously known amplifiers.

The foregoing description of background art is tendered for the purpose of disclosing information which may be pertinent in the examination of this application. It is respectfully stipulated, however, that none of the forgoing information, when considered singly or in combination, anticipates or renders the applicant' inventions obvious.

SUMMARY OF THE INVENTION

The present invention pertains to a solid state audio amplifier which exhibits the superior linearity and saturation characteristics of a vacuum tube amplifier, and which has an output impedance which nominally matches the impedance of a speaker so that an impedance matching transformer is not required. By way of example, and not of limitation, an amplifier in accordance with the present invention includes a low impedance transistor having triode-like current-voltage (I-V) characteristics such as a short-channel field effect transistor (FET), a vertical field effect transistor (VFET), a gridistor, a field-controlled diode or, preferably, a static induction transistor (SIT). The gate of the transistor is electrically coupled to an audio input source, the drain is electrically coupled to a supply voltage, a choke is connected in series between the drain and the supply voltage, and a speaker is coupled to the drain and supply leads in parallel with the choke. The choke in the present invention exhibits low impedance to direct current, and high impedance to alternating current at audio frequencies. Alternatively, the choke could be replaced with a high impedance current source.

An object of the invention is to provide a solid state amplifier having triode vacuum tube amplifier linearity characteristics.

Another object of the invention is to provide a solid state amplifier which has even order harmonic distortion.

Another object of the invention is to provide a solid state amplifier which has soft saturation characteristics.

Another object of the invention is to provide a solid state amplifier which does not require an impedance matching transformer.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DESCRIPTION OF THE PREFERRED EMBODIMENTS

Figure 1:
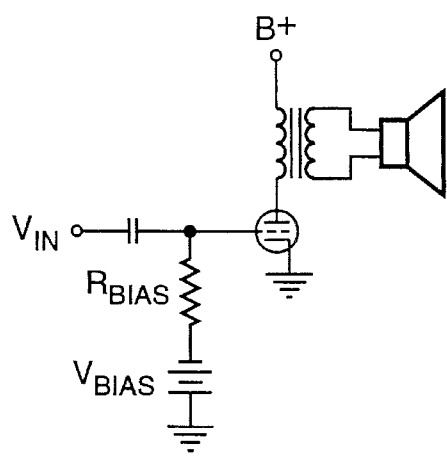
FIG. 1 is a schematic diagram of a conventional vacuum tube audio amplifier.
Figure 2:
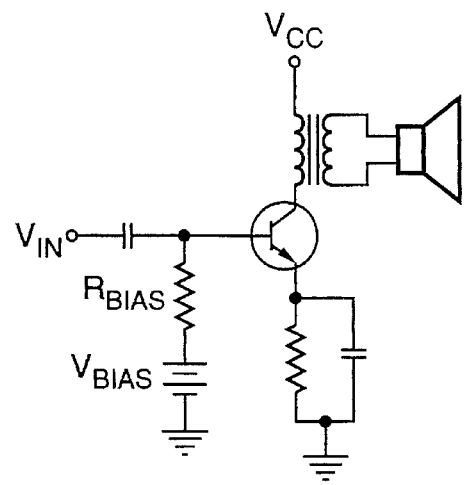
FIG. 2 is a schematic diagram of a conventional bipolar transistor equivalent of the amplifier shown in FIG. 1.
Figure 3:
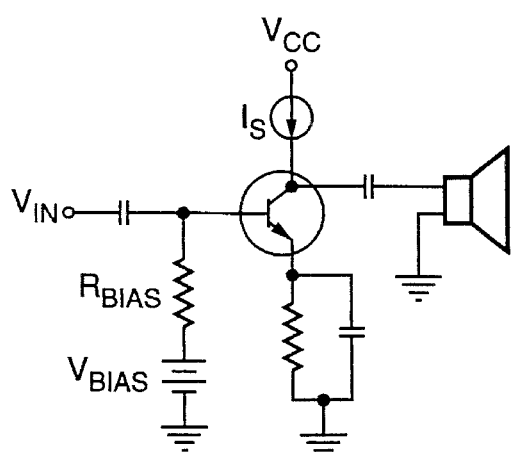
FIG. 3 is a schematic diagram of a transformerless equivalent of the amplifier configuration shown in FIG. 2.
Figure 4:
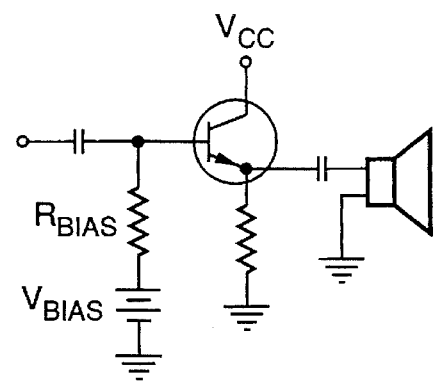
FIG. 4 is a schematic diagram of a commonly used transformerless bipolar transistor audio amplifier.
Figure 5:
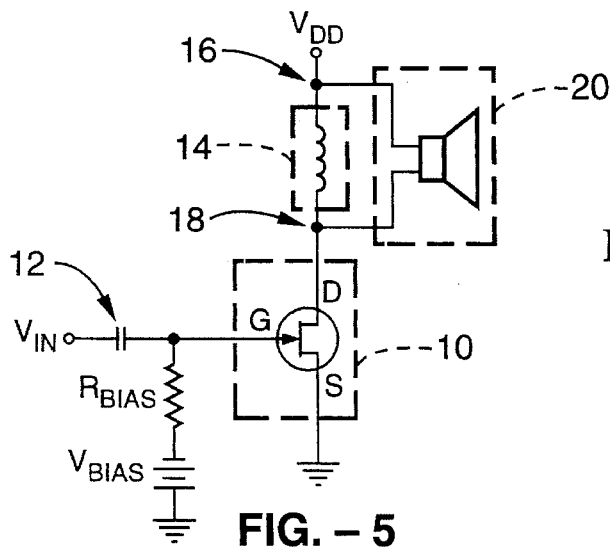
FIG. 5 is a schematic diagram of an amplifier in accordance with the present invention.

Referring more specifically to the drawings, for illustrative purposes the present invention is embodied in the apparatus generally shown in FIG. 5. It will be appreciated that the apparatus may vary as to configuration and as to details of the parts without departing from the basic concepts as disclosed herein.

Referring to FIG. 5, an amplifier in accordance with the present invention includes a low impedance transistor 10 in a single-ended, common source configuration. The gate terminal G is electrically coupled to an audio signal input terminal $V_{in}$ through a coupling capacitor 12 or the like. Gate terminal G is also electrically coupled to one node of a bias resistor $R_B$, the other node of which is electrically coupled to a bias voltage $V_{BIAS}$. The source terminal S is electrically coupled to ground, and the drain terminal D is electrically coupled to a direct current supply voltage source $V_{DD}$ through a series choke 14. A first speaker output terminal 16 is electrically coupled to drain D and a second speaker output terminal 18 is electrically coupled to $V_{DD}$. The speaker 20 is electrically coupled to speaker output terminals 16, 18 thereby connecting speaker 20 to both drain terminal D and $V_{DD}$ in parallel with choke 14.

Figure 6:
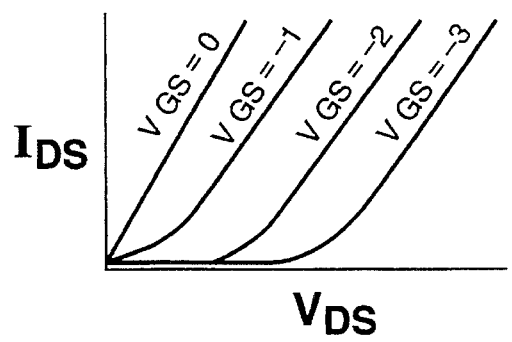
FIG. 6 is a graph showing drain-source current versus drain-source voltage at various gate-source voltage levels for the transistor in the amplifier of the present invention.
Figure 7:
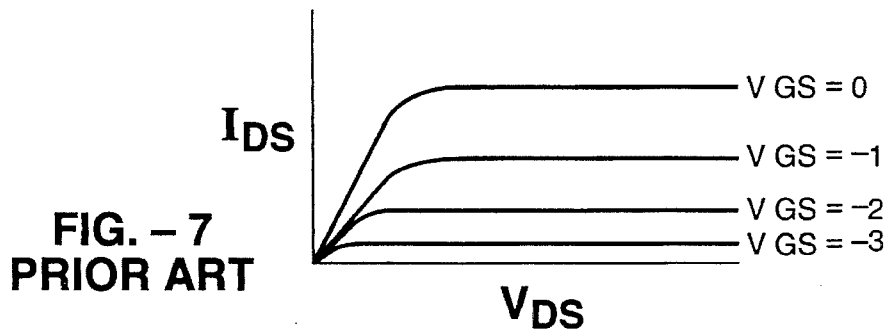
FIG. 7 is a graph showing drain-source current versus drain-source voltage at various gate-source voltage levels for a conventional field effect transistor.

Notably, transistor 10 comprises a short-channel field effect transistor (FET), a vertical field effect transistor (VFET), a gridistor, a field controlled diode or, preferably, a static induction transistor (SIT), or the like, which exhibits triode-like I-V characteristics as shown in FIG. 6. Transistor 10 is fabricated with a geometry wherein the output impedance, which is the inverse of the slope of the I-V characteristics, matches the impedance of the speaker, and is preferably approximately two to four ohms which is the nominal minimum impedance of a speaker. As can be seen from the sample I-V characteristics of a conventional FET operating in the pentode mode shown in FIG. 7, typical output impedances are on the order of several thousand ohms. Even a short-channel FET, VFET, gridistor, field controlled diode or SIT operating in the triode mode shown in FIG. 6 will typically have an output impedance of fifty to three hundred ohms. However, by substantially increasing the gate width of a short-channel FET, VFET, gridistor, field controlled diode or SIT, the output impedance can be reduced to match a typical speaker impedance. The amplifier of the present invention uses such a device to provide an output impedance that matches the impedance of a speaker. As a result, in the present invention there is no need for an impedance matching transformer interposed between the transistor and the speaker. Further, transistor 10 exhibits I-V characteristics similar to those of a triode vacuum tube, operates linearly, and has soft-saturation. To the extent that there is non-linearity in the output, the amplifier will produce even order harmonic distortion which is more acceptable to the ear than odd order harmonic distortion.

Choke 14 is selected so that it exhibits low impedance to direct current, while at the same time exhibits high impedance to alternating current (AC) at audio frequencies, thereby enabling speaker 20 to be electrically coupled in parallel with choke 14. A typical value is twenty-five millihenries.

Figure 8:
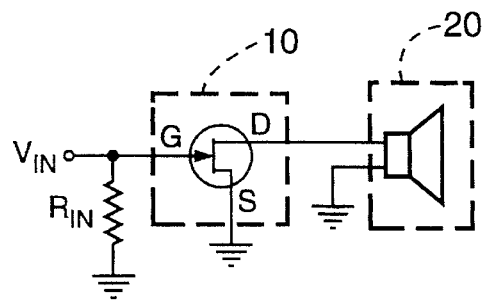
FIG. 8 is a schematic diagram showing the equivalent circuit response of the amplifier shown in FIG. 5 to alternating current at audio frequencies.
Figure 9:
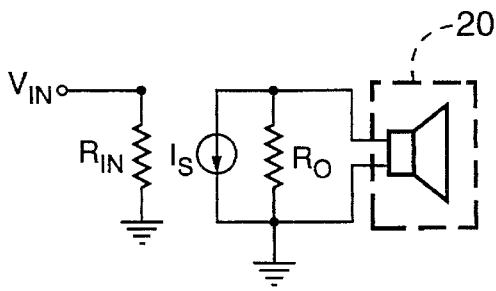
FIG. 9 is a schematic diagram showing the equivalent circuit response of the amplifier shown in FIG. 5 to alternating current at audio frequencies where the transistor is modeled as a voltage-controlled current source.
Figure 10:
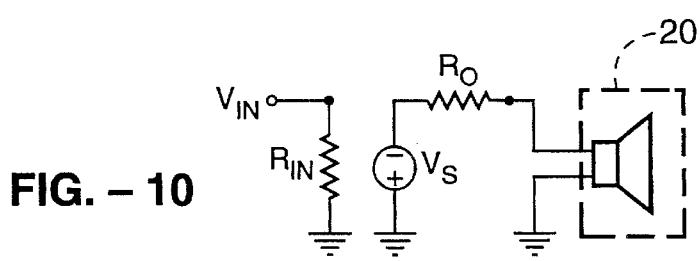
FIG. 10 is a schematic diagram of the circuit shown in FIG. 9 where the current source is modeled as an equivalent voltage source using a Norton to Thevenin transformation.

The importance of impedance matching can be seen with reference to FIG. 8 which shows that, at audio frequencies, the capacitors in FIG. 5 appear as shorts, choke 14 appears as an open circuit, and all direct current voltage sources appear as a short to AC. Accordingly, FIG. 8 represents a simplified AC circuit equivalent of FIG. 5. Referring also to FIG. 9, it will be appreciated that a field effect or other transistor can be approximated as a voltage controlled current source $I_S$. Here, $I_S = g_m \cdot V_{IN}$, where $g_m$ is the transconductance of the device and $R_O$ is the output impedance. Referring now to FIG. 10, current source $I_S$ can be represented as an equivalent voltage source $V_S$ by way of a Norton to Thevenin transformation. Here $V_S = k \cdot V_{IN}$, where $k = g_m \cdot R_O$. Therefore, FIG. 10 represents the simplified AC equivalent of the amplifier shown in FIG. 5, wherein an input voltage $V_{IN}$ amplified by a constant, k, appears across $R_O$ and the speaker. Maximum power is transferred to the speaker when $R_O$ matches the impedance of the speaker.

Figure 11:
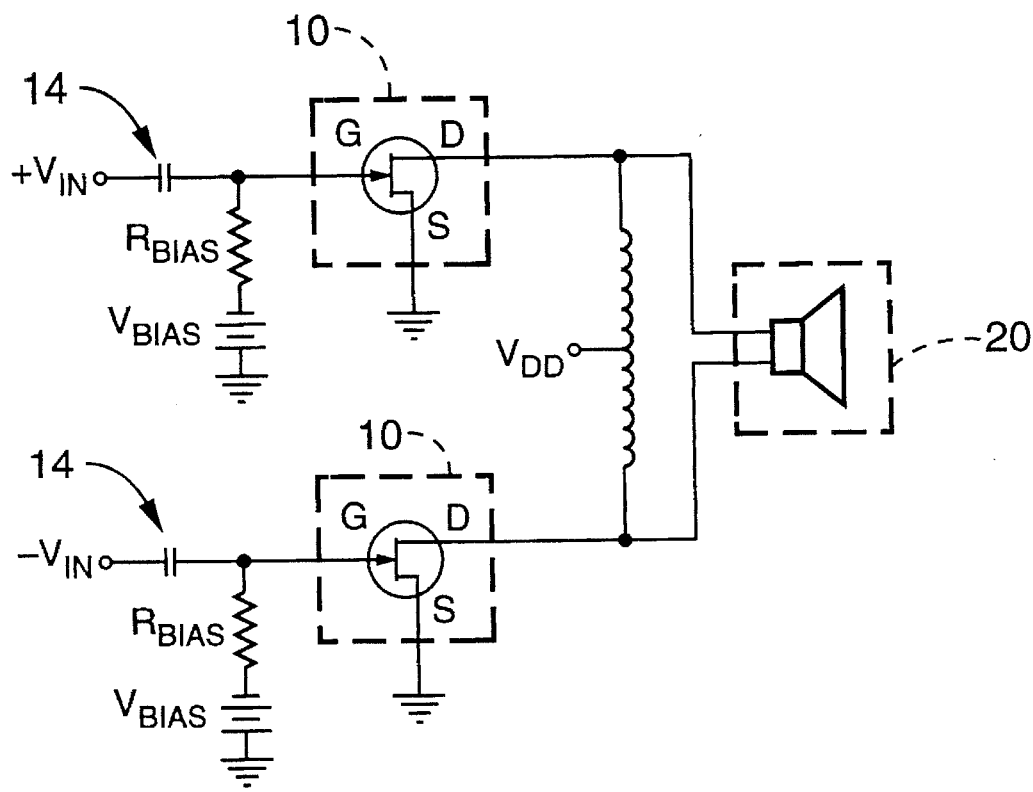
FIG. 11 is a schematic diagram of a push-pull amplifier in accordance with the present invention.
Figure 12:
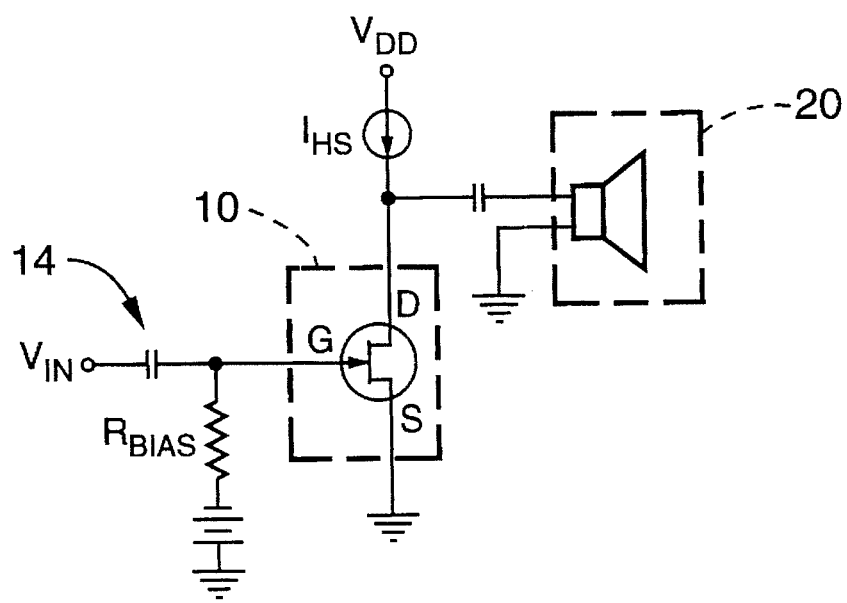
FIG. 12 is a schematic diagram of an alternative embodiment of the circuit shown in FIG. 5 wherein the choke element has been replaced with a high impedance current source.

Those skilled in the art will appreciate that transistor 10 could be biased to operate in various portions of the I-V curve as with conventional amplifiers, and that the amplifier of the present invention could be operated in other configurations, such as push-pull or the like as shown in FIG. 11. It will further be appreciated that choke 14 could be replaced with a high impedance current source $I_{HS}$ as shown in FIG. 12, in which case speaker 20 is capacitively coupled between drain D and ground.

Accordingly, it will be seen that this invention provides an audio amplifier which exhibits triode vacuum tube amplifier characteristics, has even order harmonic distortion, has soft-saturation, and has a low impedance output which can drive a speaker without the need for an impedance matching transformer. Although the description above contains many specificities, these should not be construed as limiting the scope of the invention but as merely providing illustrations of some of the presently preferred embodiments of this invention. Thus the scope of this invention should be determined by the appended claims and their legal equivalents.

I claim:

1. An audio amplifier, comprising:
   (a) a transistor, said transistor having gate, drain and source terminals, said transistor having an output impedance between approximately two and sixteen ohms;
   (b) a signal input terminal electrically connected to said gate terminal;
   (c) a DC voltage source terminal electrically connected to said drain terminal;
   (d) a choke electrically connected in series with said DC voltage source terminal and said drain terminal; and
   (e) a first speaker output terminal electrically connected to said drain terminal and a second speaker output terminal electrically connected to said DC voltage source terminal;
   (f) wherein said amplifier has an output impedance as measured across said speaker output terminals between approximately two and sixteen ohms, and wherein said output impedance matches the drive impedance of a high fidelity speaker without the need for an impedance matching transformer.

2. An amplifier according to claim 1, wherein said transistor is selected from the group consisting of a short channel field effect transistor, a static induction transistor, a vertical field effect transistor, a field controlled diode, and a gridistor.

3. A transformerless amplifier, comprising:
   (a) a transistor, said transistor having gate, drain and source terminals, said transistor having triode current-voltage characteristics and an output impedance between approximately two and sixteen ohms;
   (b) a signal input terminal electrically connected to said gate terminal;
   (c) a DC voltage source terminal electrically connected to said drain terminal;
   (d) a choke electrically connected in series with said DC voltage source and said drain terminal, said choke having a low impedance to direct current and a high impedance to alternating current audio frequencies; and
   (e) a first speaker output terminal electrically connected to said drain terminal and a second speaker output terminal electrically connected to said DC voltage source terminal and in parallel with said choke;
   (f) wherein said amplifier has an output impedance as measured across said speaker output terminals between approximately two and sixteen ohms, and wherein said output impedance matches the drive impedance of a high fidelity speaker without the need for an impedance matching transformer.

4. An amplifier according to claim 3, wherein said transistor is selected from the group consisting of a short channel field effect transistor, a static induction transistor, a vertical field effect transistor, a field controlled diode, and a gridistor.

5. An impedance matched amplifier, comprising:
   (a) a transistor, said transistor having gate, drain and source terminals, said transistor having an output impedance ranging from approximately two ohms to sixteen ohms, said transistor having triode current-voltage characteristics;
   (b) a signal input terminal electrically connected to said gate terminal;
   (c) a DC voltage source terminal electrically connected to said drain terminal;
   (d) a choke electrically connected in series with said DC voltage source and said drain terminal, said choke having a low impedance to direct current and a high impedance to alternating current audio frequencies; and
   (e) speaker output terminals electrically connected in parallel with said choke;
   (f) wherein said amplifier has an output impedance as measured across said speaker output terminals between approximately two and sixteen ohms, and wherein said output impedance matches the drive impedance of a high fidelity speaker without the need for an impedance matching transformer.

6. An amplifier according to claim 5, wherein said transistor is selected from the group consisting of a short channel field effect transistor, a static induction transistor, a vertical field effect transistor, a field controlled diode, and a gridistor.

7. An audio amplifier, comprising:
   (a) a transistor, said transistor having gate, drain and source terminals, said transistor having an output impedance between approximately two ohms and sixteen ohms;
   (b) a signal input terminal electrically connected to said gate terminal;
   (c) a DC voltage source terminal electrically connected to said drain terminal;
   (d) a high impedance current source electrically connected in series with said DC voltage source terminal and said drain terminal; and
   (e) a speaker output terminal electrically coupled to said drain terminal;
   (f) wherein said amplifier has an output impedance between approximately two and sixteen ohms, and wherein said output impedance matches the drive impedance of a high fidelity speaker without the need for an impedance matching transformer.

8. An amplifier according to claim 7, wherein said transistor is selected from the group consisting of a short channel field effect transistor, a static induction transistor, a vertical field effect transistor, a field controlled diode, and a gridistor.

9. A transformerless amplifier, comprising:
   (a) a transistor, said transistor having gate, drain and source terminals, said transistor having triode current-voltage characteristics and an output impedance between approximately two ohms and sixteen ohms;
   (b) a signal input terminal electrically connected to said gate terminal;
   (c) a DC voltage source terminal electrically connected to said drain terminal;
   (d) a high impedance current source electrically connected in series with said DC voltage source terminal and said drain terminal; and
   (e) a speaker output terminal electrically coupled to said drain terminal;
   (f) wherein said amplifier has an output impedance between approximately two and sixteen ohms, and wherein said output impedance matches the drive impedance of a high fidelity speaker without the need for an impedance matching transformer.

10. An amplifier according to claim 9, wherein said transistor is selected from the group consisting of a short channel field effect transistor, a static induction transistor, a vertical field effect transistor, a field controlled diode, and a gridistor.

11. An impedance matched amplifier, comprising:

(a) a transistor, said transistor having gate, drain and source terminals, said transistor having an output impedance ranging from approximately two ohms to sixteen ohms, said transistor having triode current-voltage characteristics;

(b) a signal input terminal electrically connected to said gate terminal;

(c) a DC voltage source terminal electrically connected to said drain terminal;

(d) a high impedance current source electrically connected in series with said DC voltage source terminal and said drain terminal; and (e) a speaker output terminal electrically coupled to said drain terminal;

(f) wherein said amplifier has an output impedance between approximately two and sixteen ohms, and wherein said output impedance matches the drive impedance of a high fidelity speaker without the need for an impedance matching transformer.

12. An amplifier according to claim 11, wherein said transistor is selected from the group consisting of a short channel field effect transistor, a static induction transistor, a vertical field effect transistor, a field controlled diode, and a gridistor.

\* \* \* \* \*